United States Patent
Lai et al.

(10) Patent No.: US 11,726,122 B2
(45) Date of Patent: Aug. 15, 2023

(54) ANTENNA TESTING DEVICE AND METHOD FOR HIGH FREQUENCY ANTENNAS

(71) Applicant: Taiwan Semiconductor Manufacturing Co., Ltd., Hsinchu (TW)

(72) Inventors: Chi-Chang Lai, Taichung (TW); Kai-Yi Tang, New Taipei (TW); Mill-Jer Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 412 days.

(21) Appl. No.: 16/914,666

(22) Filed: Jun. 29, 2020

(65) Prior Publication Data

US 2021/0405102 A1 Dec. 30, 2021

(51) Int. Cl.
G01R 29/14 (2006.01)
G01R 31/28 (2006.01)
G01R 29/10 (2006.01)

(52) U.S. Cl.
CPC .......... *G01R 29/105* (2013.01); *G01R 29/10* (2013.01); *G01R 31/2822* (2013.01)

(58) Field of Classification Search
CPC .. G06R 29/10; G01R 31/2822; G01R 29/105; G01R 31/2889; G01R 29/12
See application file for complete search history.

(56) References Cited

U.S. PATENT DOCUMENTS

| | | | | |
|---|---|---|---|---|
| 9,237,839 B2* | 1/2016 | Nisani | ..... | A61B 1/045 |
| 2010/0237854 A1* | 9/2010 | Kumhyr | ..... | G01R 33/10 |
| | | | | 702/57 |
| 2012/0268102 A1* | 10/2012 | Hori | ..... | H01H 57/00 |
| | | | | 200/181 |
| 2016/0277522 A1* | 9/2016 | Singh | ..... | H04L 65/65 |
| 2018/0160324 A1* | 6/2018 | Tan | ..... | H04B 17/23 |
| 2019/0349096 A1* | 11/2019 | Wadell | ..... | G01R 31/2893 |

FOREIGN PATENT DOCUMENTS

| | | | | |
|---|---|---|---|---|
| CN | 206743253 | * 12/2017 | ..... | H04B 17/00 |
| CN | 206743254 | * 12/2017 | ..... | H04B 17/00 |

* cited by examiner

*Primary Examiner* — Diane L Lo
*Assistant Examiner* — Abusayeed M Haque
(74) *Attorney, Agent, or Firm* — McClure, Qualey & Rodack, LLP

(57) ABSTRACT

A testing device for testing an antenna is provided. The testing device includes a housing, an antenna module, and a receiving module. The antenna module is used for holding the antenna and disposed on the housing, wherein the antenna is coupled to an antenna testing apparatus. The receiving module is disposed on the housing and includes a coupling radiation element physically separated from the antenna, wherein the receiving module is configured to receive an excited signal emitted from the antenna.

20 Claims, 14 Drawing Sheets

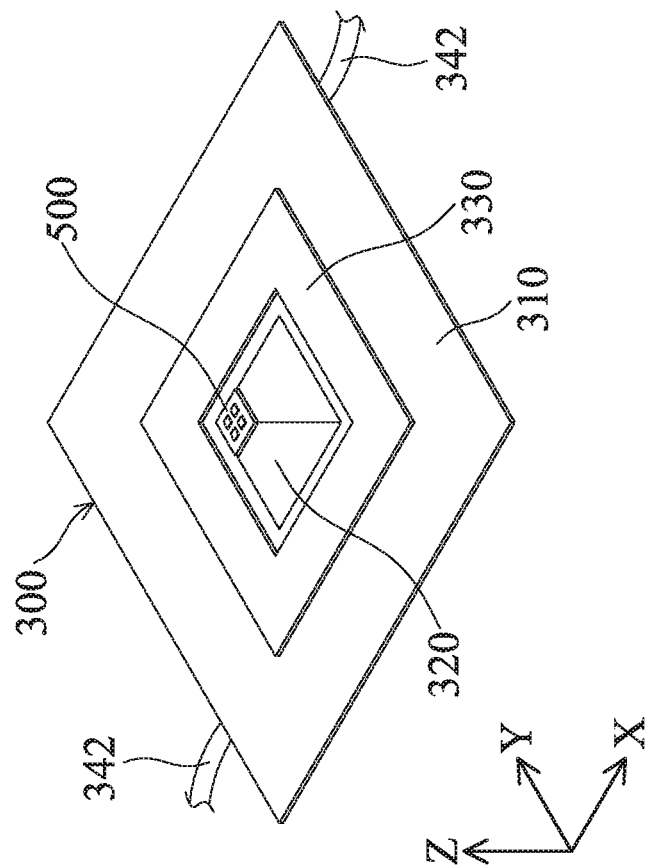
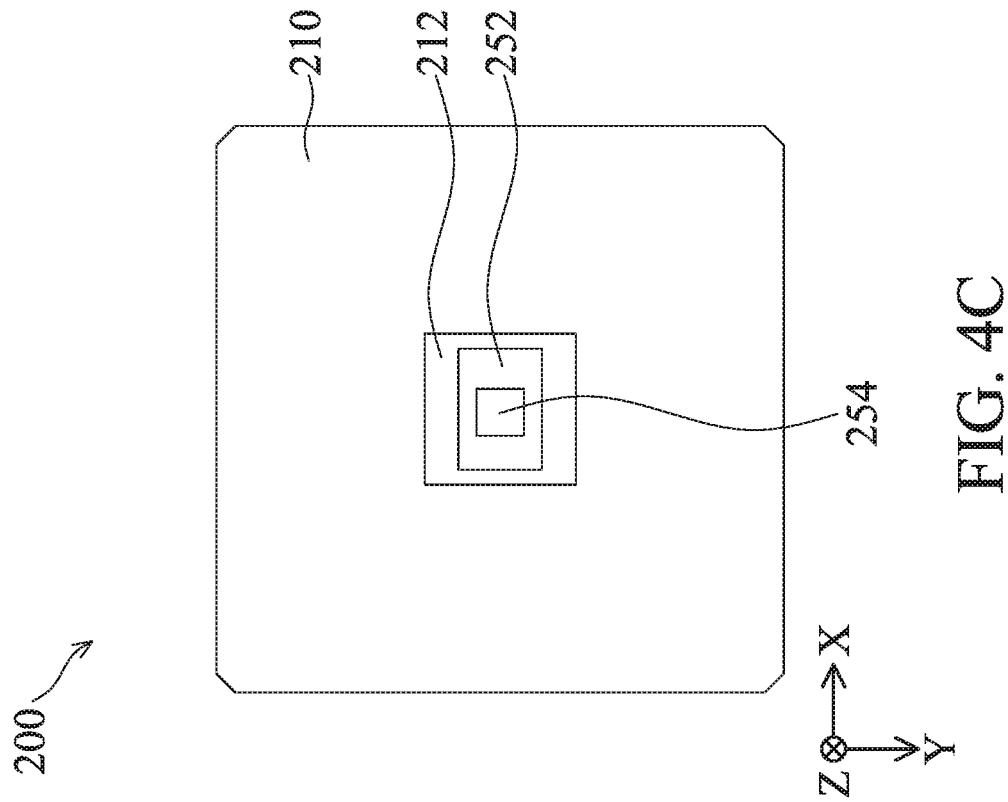
FIG. 5
FIG. 4C

ANTENNA TESTING DEVICE AND METHOD FOR HIGH FREQUENCY ANTENNAS

BACKGROUND

Many modern day electronic devices comprise integrated chips that use antennas to communicate wirelessly with other electronic devices. Integrated chips can use off-chip antennas or on-chip, integrated antennas. Off-chip antennas are external components connected to an integrated chip. Integrated antennas are built within the integrated chip. For example, integrated antennas (e.g., thin film micro-strip antennas) used in high frequency wireless communication devices (e.g., devices operating in the millimeter region of the electromagnetic spectrum) often use planar antennas disposed on a high frequency substrate or high frequency printed circuit board (HF PCBs). How to test these high frequency antennas has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4C is a bottom view of the housing, in accordance with some embodiments of the present disclosure.

FIG. 5 is a perspective view of the antenna module and the antenna, in accordance with some embodiments.

DETAILED DESCRIPTION

Figure 1:
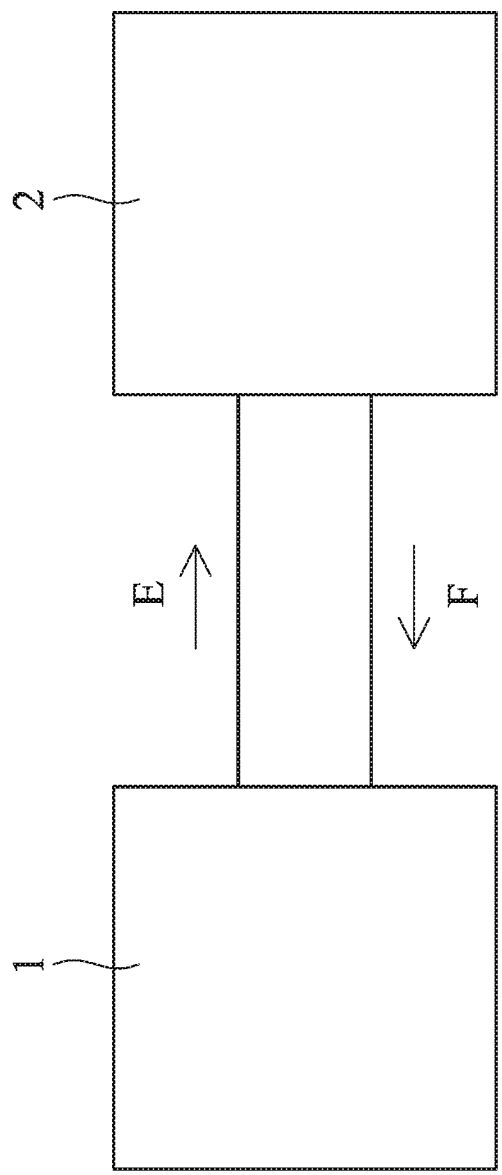
FIG. 1 is a schematic view of a testing system in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Antenna used in current $5^{th}$ generation (5G) mobile networks may be an antenna integrated in the package (AiP, or antenna in package), which has a high frequency range relative to traditional antennas. For example, the signal emitted by the antenna integrated in the package is mmwave (i.e. having wavelength in millimeter scale). The antennas are tested during the manufacturing processes. Usually, traditional antennas are tested by a contact-based method, such as receiving the signal emitted from the antenna through a pogo pin that is in direct contact with the antenna. However, such contact-based method is not completely compatible to high frequency signals.

Therefore, embodiments related to testing apparatuses for testing the antenna having high frequency are provided in the present disclosure. The antenna testing device mainly includes a housing, an antenna module for holding the antenna, and a receiving module for receiving signal emitted from the antenna. In particular, the antenna is physically separated from the receiving module, so that the signal emitted from the antenna is received by the receiving module in a wireless manner that is compatible to high frequency signal. In some embodiments, an interposer is provided for the antenna testing apparatus to reduce the leakage loss of the signal emitted from the antenna. In some embodiments, a flexible thin film is provided for the antenna testing apparatus to transmit 5G/mmwave signal.

FIG. 1 is a schematic view of a testing system in some embodiments of the present disclosure. The testing system includes a testing device 1 and an antenna testing apparatus 2. In some embodiments, the antenna testing apparatus 2 is used for providing a feeding signal F to the testing device 1 for testing an antenna, and then the testing device 1 returns an excited signal E to the antenna testing apparatus 2. As such, the performance of the antenna in response to the feeding signal F may be tested to determine whether the antenna is qualified for design requirement.

Figure 2B:
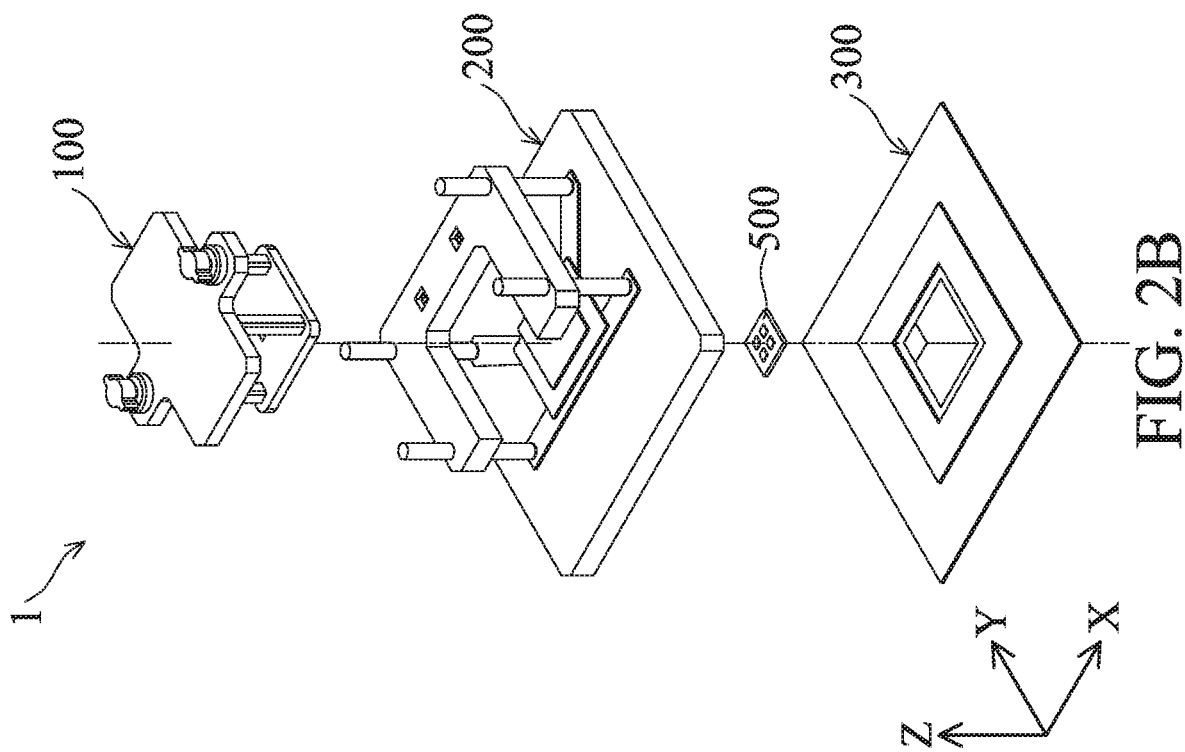
FIG. 2B is an exploded view of the testing device in some embodiments of the present disclosure.
Figure 2A:
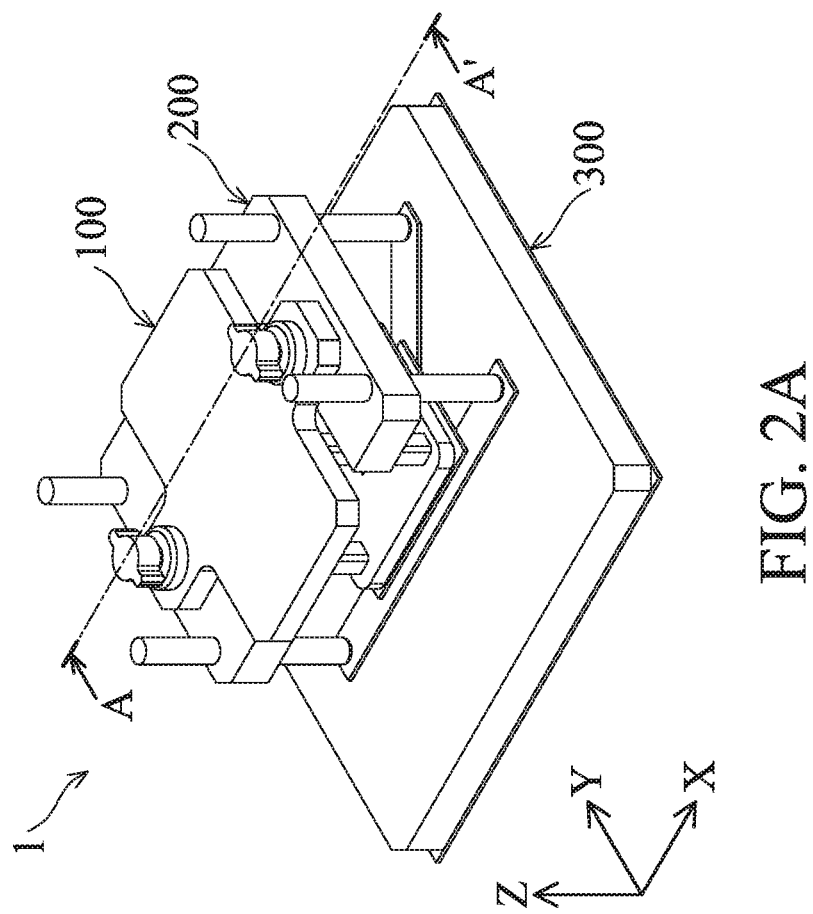
FIG. 2A is a perspective view of a testing device in some embodiments of the present disclosure.
Figure 2C:
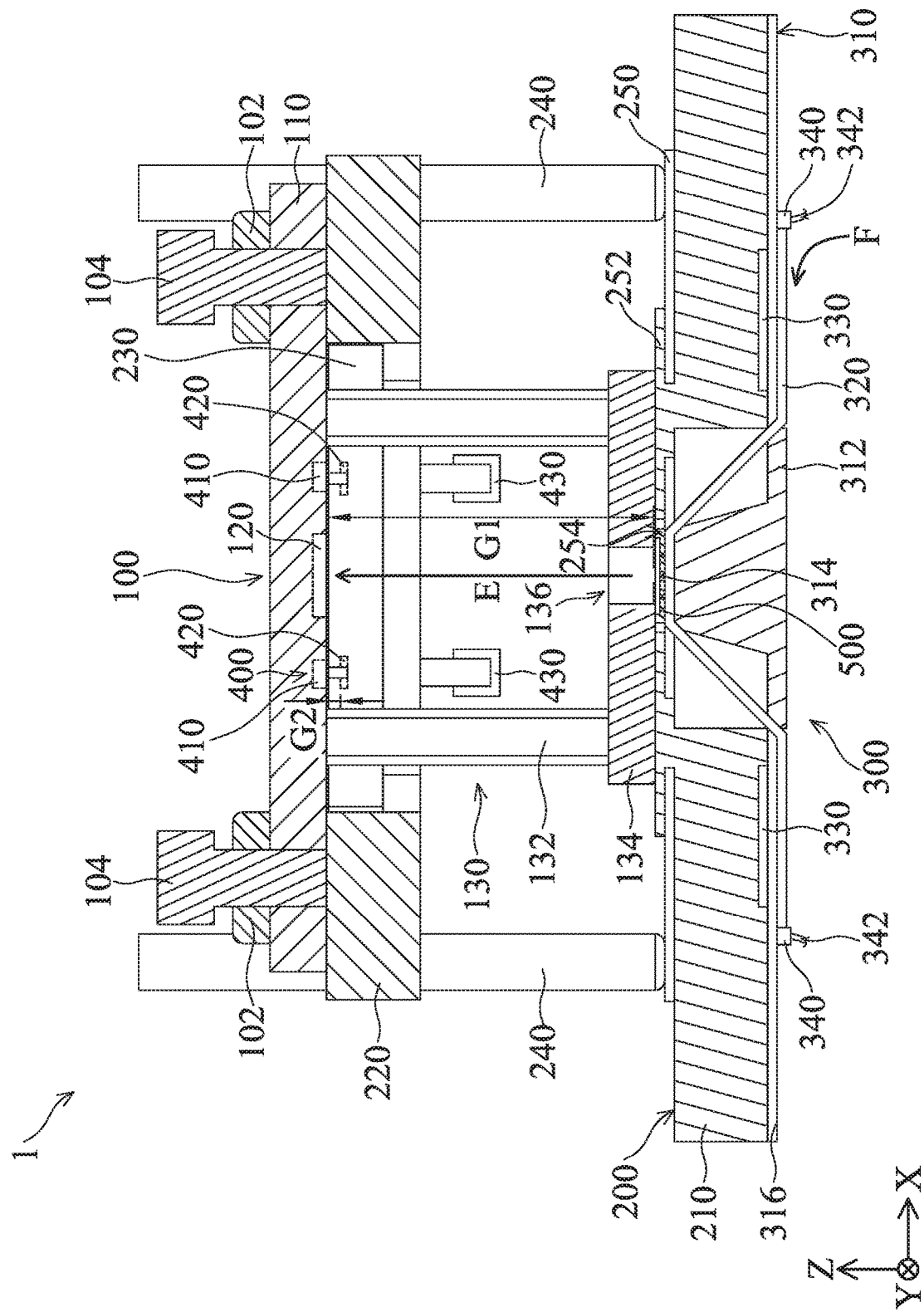
FIG. 2C is a cross-sectional view of the testing device in some embodiments of the present disclosure.
Figure 2D:
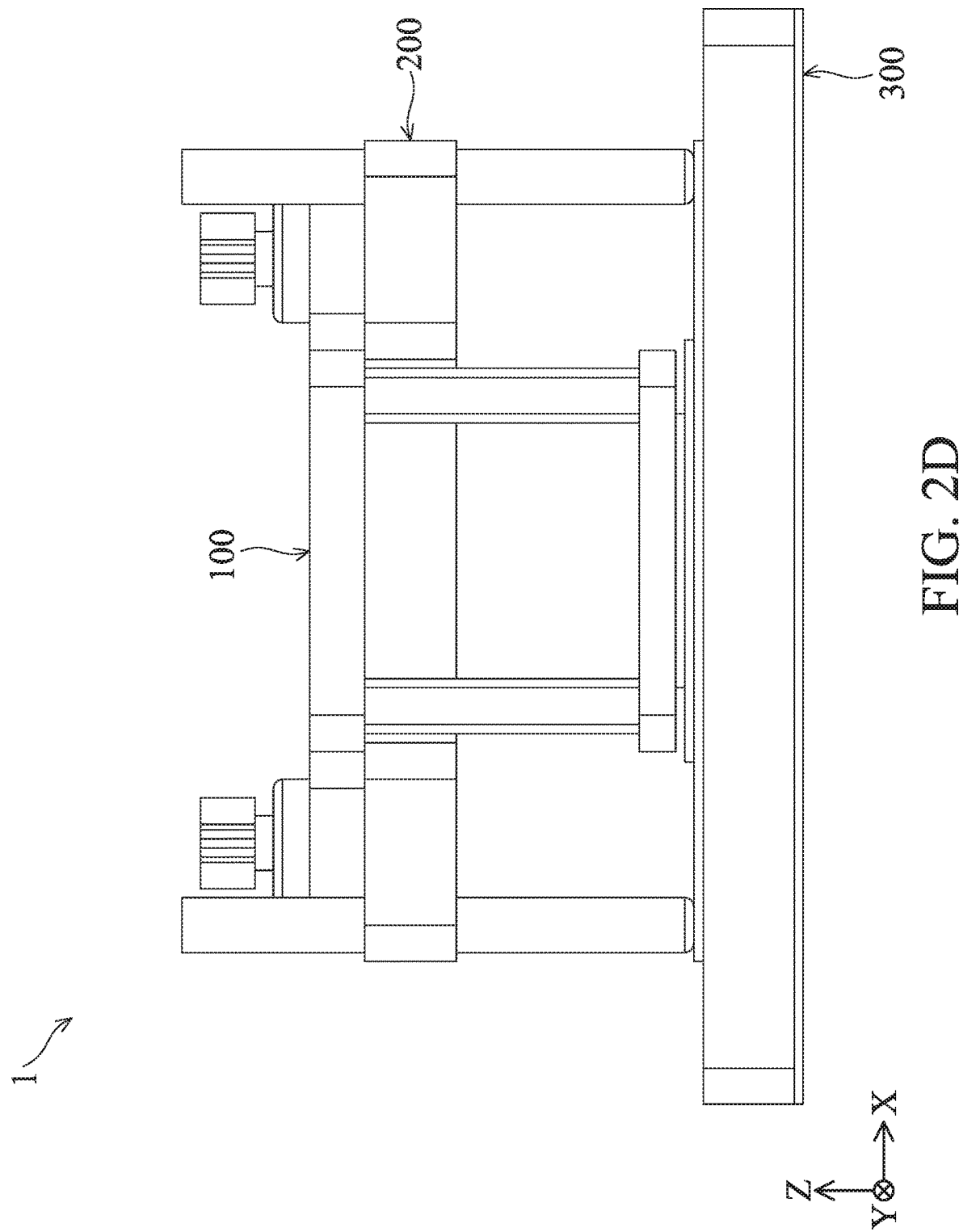
FIG. 2D is a side view of the testing device in some embodiments of the present disclosure.

FIG. 2A is a perspective view of the testing device 1, in accordance with some embodiments of the present disclosure. FIG. 2B is an exploded view of the testing device 1, in accordance with some embodiments of the present disclosure. FIG. 2C is a cross-sectional view of the testing device 1, in accordance with some embodiments of the present disclosure. FIG. 2D is a side view of the testing device 1, in accordance with some embodiments of the present disclosure. In some embodiments, the testing device 1 includes a receiving module 100, a housing 200, an antenna module 300, and a connecting assembly 400. In some embodiments, an antenna 500 is disposed on the antenna module 300, and coupled to the antenna testing apparatus 2 via the testing device 1.

In some embodiments, the testing device 1 is used for testing the antenna 500 (device under test, DUT). The antenna 500 may be, for example, an antenna integrated in package. In some embodiments, the antenna 500 is configured to receive and emit mmwave signals, such as signals with frequency between about 15 GHz to about 39 GHz, such as 28 GHz, and is suitable for 5G applications. As shown in FIG. 2C, the antenna 500 is configured to emit an excited signal E in response to a feeding signal F provided by the antenna testing apparatus 2, wherein the receiving module 100 is configured to receive the excited signal E emitted from the antenna 500 in a wireless manner, and is suitable for receiving the mmwave signal. In some embodiments, the first coupling radiation element 120 of the receiving module 100 is physically separated from (i.e., not in contact with) the antenna 500 when testing the antenna 500. For example, a first coupling gap G1 is formed between the antenna 500 and the first coupling radiation element 120 of the receiving module 100 to allow the antenna 500 coupled to the first coupling radiation element 120 in a wireless manner. For example, the first coupling radiation element 120 faces the antenna 500, and the radiation path is free form obstructions, such as metal layers.

Figures 3A, 3B:
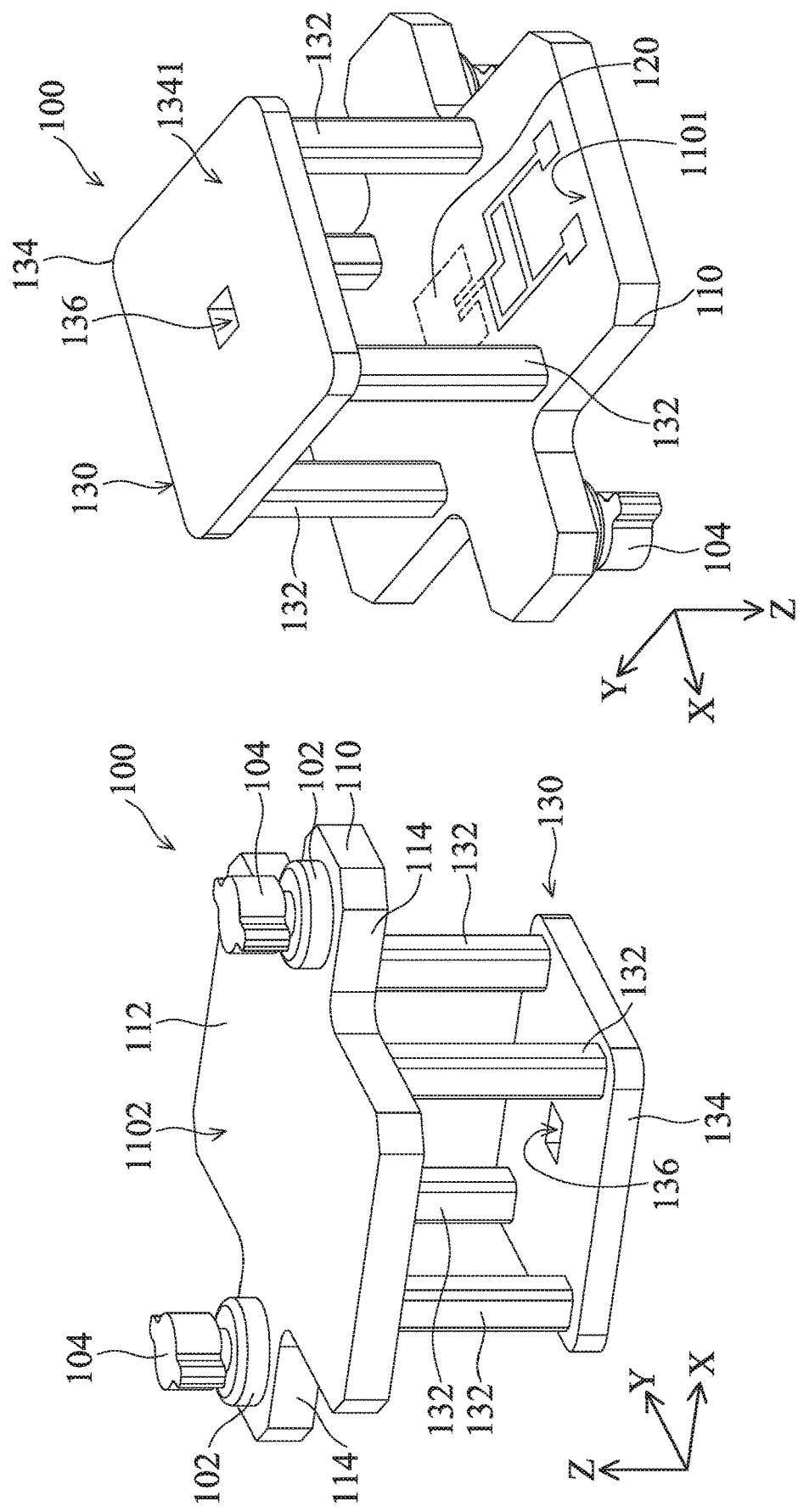
FIG. 3A and FIG. 3B are perspective views of the receiving module when viewed in different directions, in accordance with some embodiments of the present disclosure.

FIG. 3A and FIG. 3B are perspective views of the receiving module 100 when viewed in different directions, in accordance with some embodiments of the present disclosure. In some embodiments, referring to FIG. 2C, FIG. 3A, and FIG. 3B, the receiving module 100 includes a substrate 110, a first coupling radiation element 120 disposed on a bottom side 1101 of the substrate 110 which faces the antenna 500, and a support 130 disposed on the bottom side 1101 of the substrate 110. The first coupling radiation element 120 is disposed between the substrate 110 and the support 130.

In some embodiments, the receiving module 100 further includes protruding portions 102 and fastening elements 104. The protruding portions 102 are disposed on a top side 1102 of the substrate 110 which is opposite to the bottom side 1101. In some embodiments, the fasten element 104 penetrates the protruding portion 102 and the substrate 110 to in direct contact with the housing 200 for fasten the receiving module 100 to the housing 200, as shown in FIG. 2C. The fasten element 104 may rotate or move horizontally and/or vertically. In some embodiments, the fastening elements 104 include clamps, knob clamps, clips, other elements that may fasten the receiving module 100 to the housing 200. Further, it is understood that any number of fastening elements 104 may be utilized. In some embodiments, the substrate 110 includes a substantially square main body 112 and a pair of extending portions 114 extended from the main body 112, as shown in FIG. 3A. In some embodiments, the extending portions 114 are opposite to each other. In some embodiments, the protruding portions 102 and the fastening elements 104 are disposed on the extending portions 114.

In some embodiments, the support 130 includes a plurality of columns 132 and a main body 134, as shown in FIG. 3A and FIG. 3B. The main body 134 and the substrate 110 are connected by the columns 132, and the main body 134 has a bottom surface 1341 facing away from the substrate 110. In some embodiments, an opening 136 is formed on the main body 134. In some embodiments, as shown in FIG. 2C, the antenna 500 is partially exposed from the opening 136 of support 130, so the antenna 500 is exposed from the housing 200 and the receiving module 100. Another portion of the antenna 500 that is not exposed from the opening 136 is disposed between the support 130 of the receiving module 100 and the antenna module 300, and is in direct contact with the bottom surface 1341, so that the support 130 in direct contact with the antenna 500, and the position of antenna 500 is fixed by the support 130.

Figure 3D:
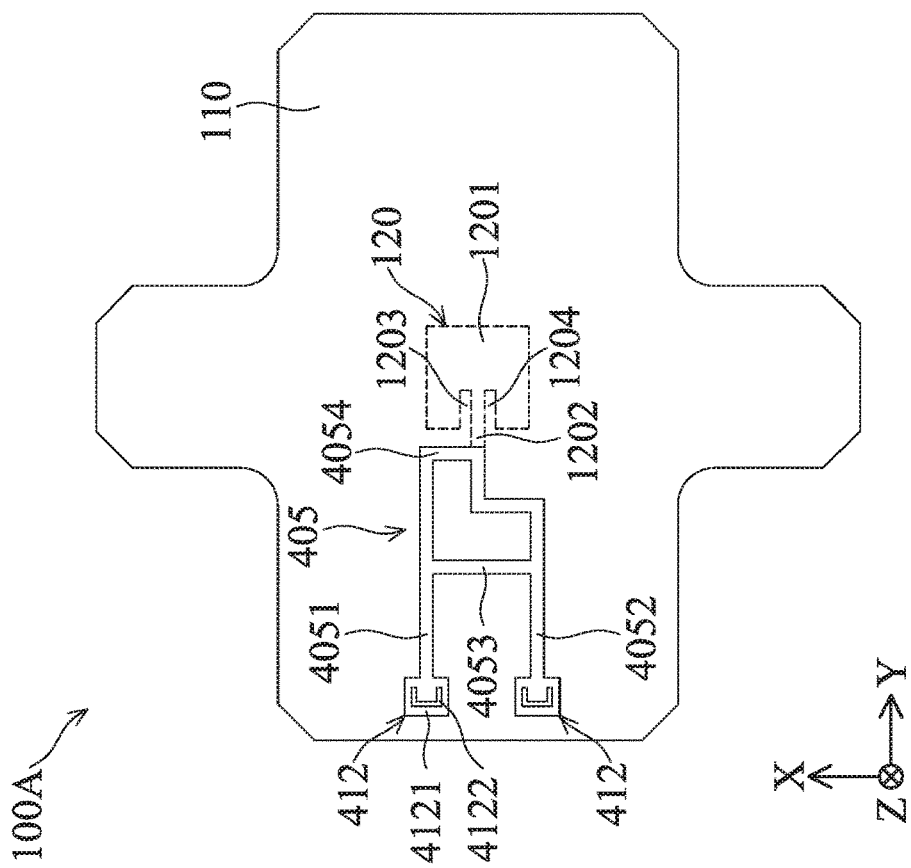
FIG. 3D is a bottom view of a receiving module, in accordance with some embodiments of the present disclosure.
Figure 3C:
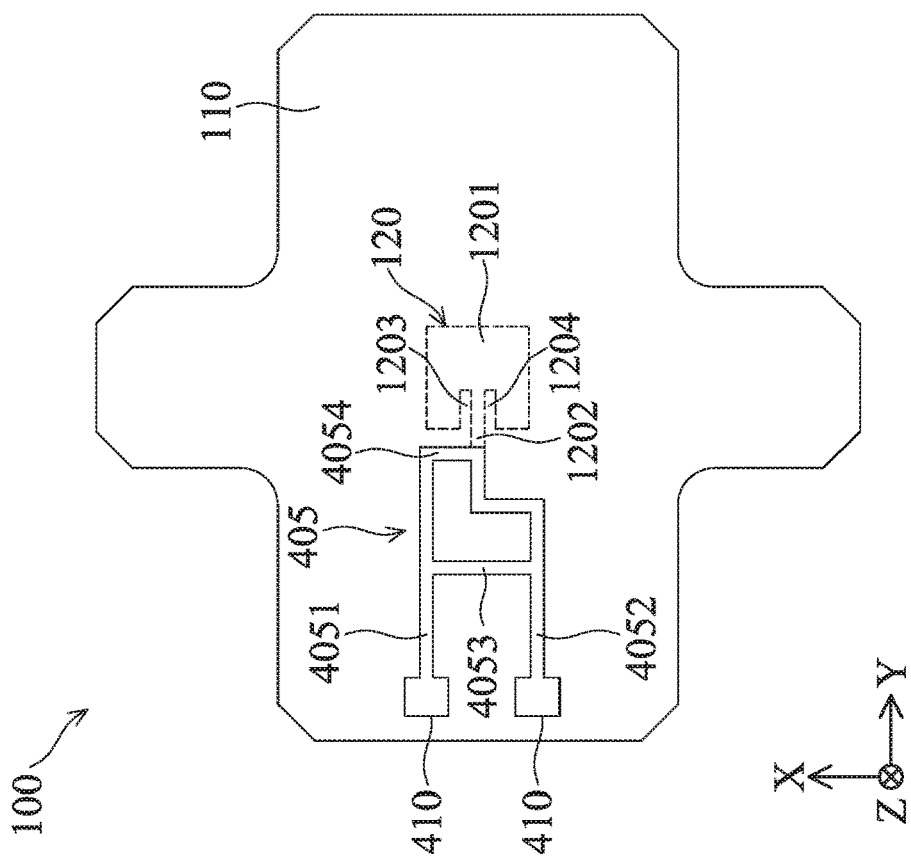
FIG. 3C is a bottom view of the substrate and the radiation coupling element, in accordance with some embodiments of the present disclosure.

FIG. 3C is a bottom view of the substrate 110 and the first coupling radiation element 120 in accordance with some embodiments of the present disclosure, wherein the support 130 is omitted for simplicity. In some embodiments, the first coupling radiation element 120 is embedded in the substrate 110 and is coupled to the antenna 500. In some other embodiments, the coupling element 120 is disposed on the substrate 110. In some embodiments, the first coupling radiation element 120 is configured to receive the excited signal E emitted from the antenna 500. In some embodiments, as shown in FIG. 3C, the first coupling radiation element 120 includes a U-shaped coupling portion 1201 and a first branch 1202 extending from the recess of the coupling portion 1201. A first opening recess 1203 and a second opening recess 1204 are formed between the coupling portion 1201 and the first branch 1202. In some alternative embodiments, the coupling portion 1201 may have other shapes, such as rectangular, triangle, circular, other suitable shapes, etc. In some embodiments, the first coupling radiation element 120 includes multiple layers, such as multiple conductive layers with dielectric layers between the conductive layers, e.g. two or three conductive layers, so that the size of the first coupling radiation element 120 may be reduced.

In some embodiments, as shown in FIG. 3C, the first coupling radiation element 120 is electrically connected to two feeding radiation elements 410 through a coupling wiring 405. In some embodiments, the coupling wiring 405 and the feeding radiation elements 410 are disposed on the receiving module 100 and electrically connected to the first coupling radiation element 120, and are exposed from the substrate 110. In some embodiments, the coupling wiring 405 includes a first connecting branch 4051, a second connecting branch 4052, a third connecting branch 4053, and a fourth connecting branch 4054. The two feeding radiation elements 410 are connected to the first connecting branch 4051 and the second connecting branch 4052, respectively. In some embodiments, the length of the first connecting branch 4051 is greater than the length of the second connecting branch 4052. In some embodiments, the first connecting branch 4051 and the second connecting branch 4052 are connected by the third connecting branch 4053 and the fourth connecting branch 4054. In some embodiments, the third connecting branch 4053 has a linear shape, and the fourth connecting branch 4054 has a stepped shape. In some embodiments, the first coupling radiation element 120 connects to the fourth connecting branch 4054, and then connects to the feeding radiation elements 410 through the first connecting branch 4051 and the second connecting branch 4052.

FIG. 3D is a bottom view of a receiving module 100A (wherein the support 130 is omitted for simplicity) in accordance with some embodiments of the present disclosure. The receiving module 100A is similar to the receiving module 100 shown in FIG. 3C, wherein the feeding radiation elements 410 is substituted by feeding radiation elements 412. Each of the feeding radiation elements 412 includes a planar patch 4121 and a slot 4122 formed on the planar patch 4121. The slot 4122 increases the frequency of the wave that can be transmitted by the feeding radiation element 412. In some embodiments, the slot 4122 may be U-shaped, I-shaped, S-shaped, or J-shaped, other suitable shapes, etc.

Figure 3E:
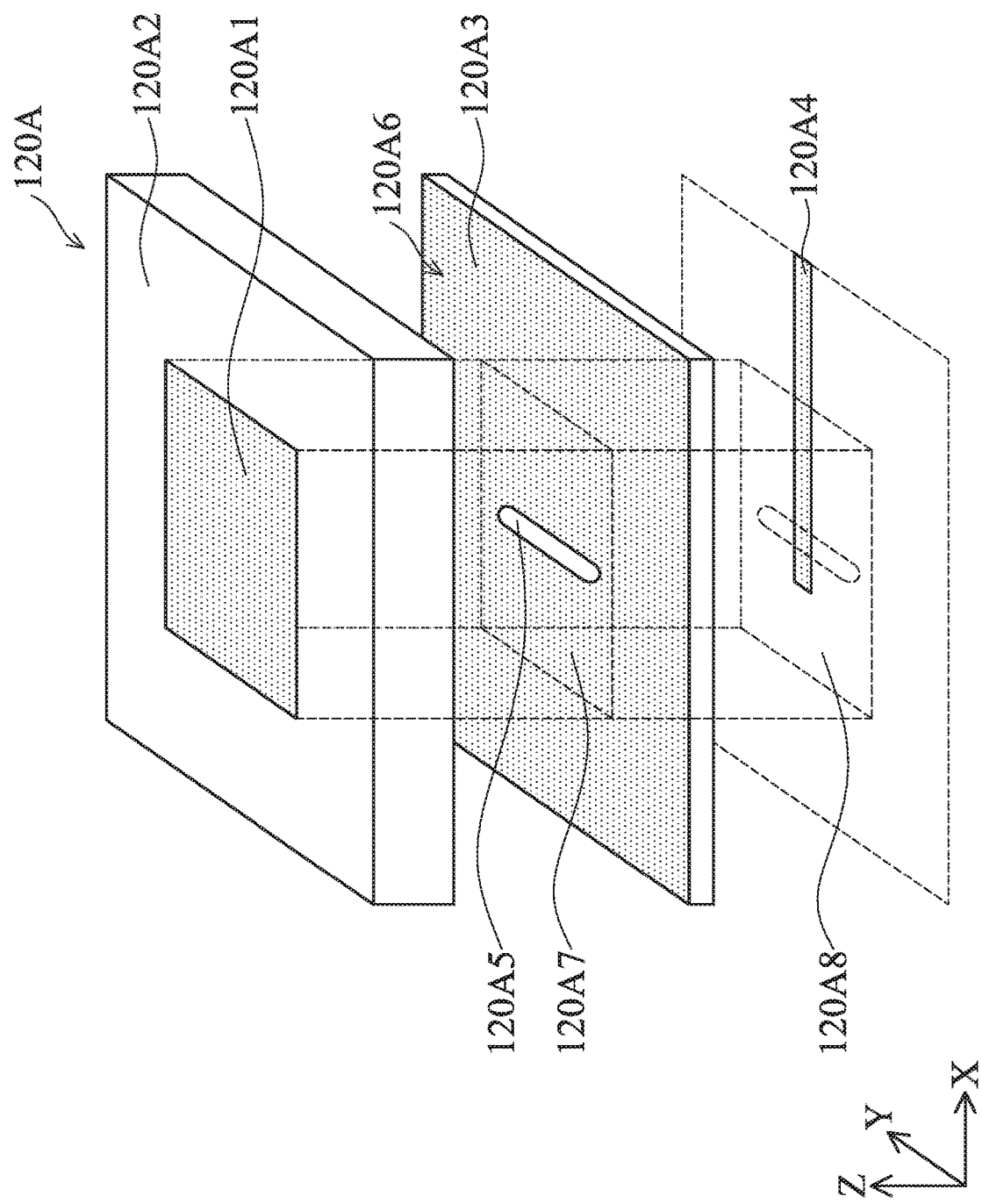
FIG. 3E is a schematic view of a first coupling radiation element, in accordance with some embodiments of the present disclosure.

FIG. 3E is a schematic view of a first coupling radiation element 120A, in accordance with some embodiments of the present disclosure. In some embodiments, the first coupling radiation element 120 in FIG. 3C may be substituted by the first coupling radiation element 120A, depending on design requirement. In some embodiments, the first coupling radiation element 120A is an aperture antenna, and includes a patch 120A1 disposed on an antenna substrate 120A2, a circuit substrate 120A3, and a matching stub 120A4. The circuit substrate 120A3 is disposed between the antenna substrate 120A2 and the matching stub 120A4, and the circuit substrate 120A3 includes a slot 120A5. The matching stub 120A4 is coupled to the patch 120A1. In some embodiments, a ground plane 120A6 of the circuit substrate 120A3 faces the patch 120A1 and the antenna substrate 120A2, and is used for connecting to a ground voltage. In some embodiments, the slot 120A5 is positioned in a projection 120A7 of the patch 120A1 on the circuit substrate 120A3, and a projection 120A8 of the patch 120A1 and the slot 120A5 partially covers the matching stub 120A4 to allow the signal received by the patch 120A1 be transmitted to the matching stub 120A4 through the slot 120A5. The slot 120A5 is linear shaped, so that the signal passes through the slot 120A5 may be enhanced. In some embodiments, the matching stub 120A4 is electrically connected to the feeding radiation elements 410 to transmit the excited signal E received by the first coupling radiation element 120A.

In some embodiments, the material of the first coupling radiation element 120, the patch 120A1, the matching stub 120A4, the coupling wiring 405, or the feeding radiation elements 410 include metal, such as copper, silver, aluminum, iron, or an alloy thereof. In some embodiments, the antenna substrate 120A2 includes a flame retardant 4 (FR4) substrate, a printed circuit board (PCB), or a flexible circuit board (FCB).

Figure 4B:
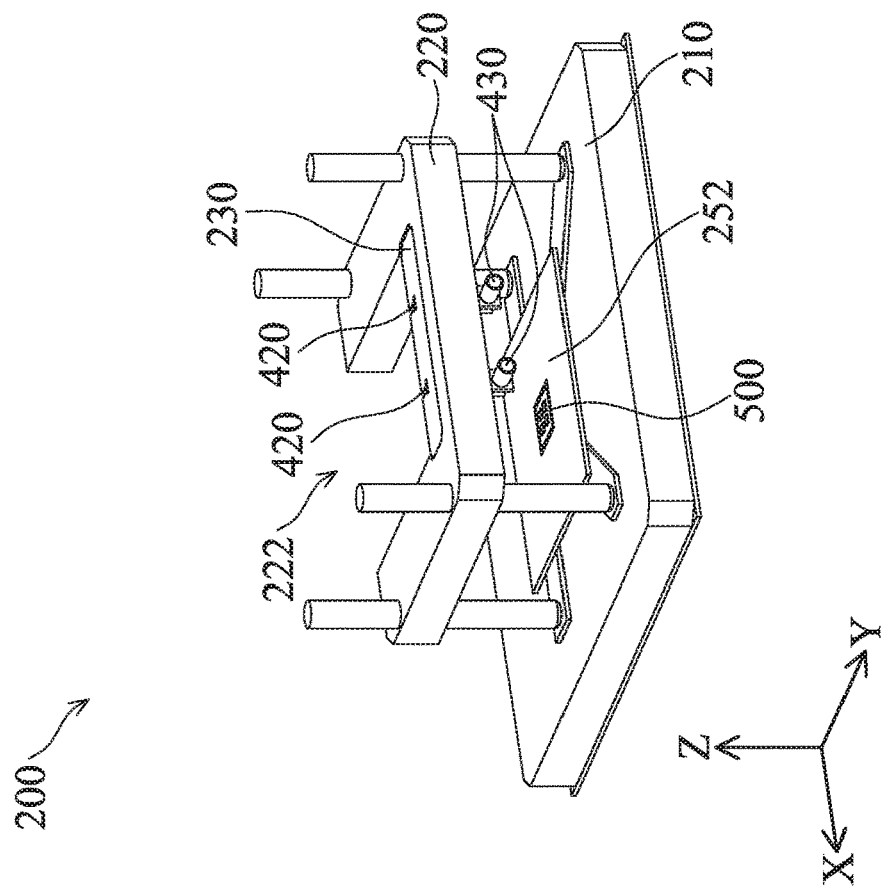
FIG. 4B is a perspective view of the housing, in accordance with some embodiments of the present disclosure.
Figure 4A:
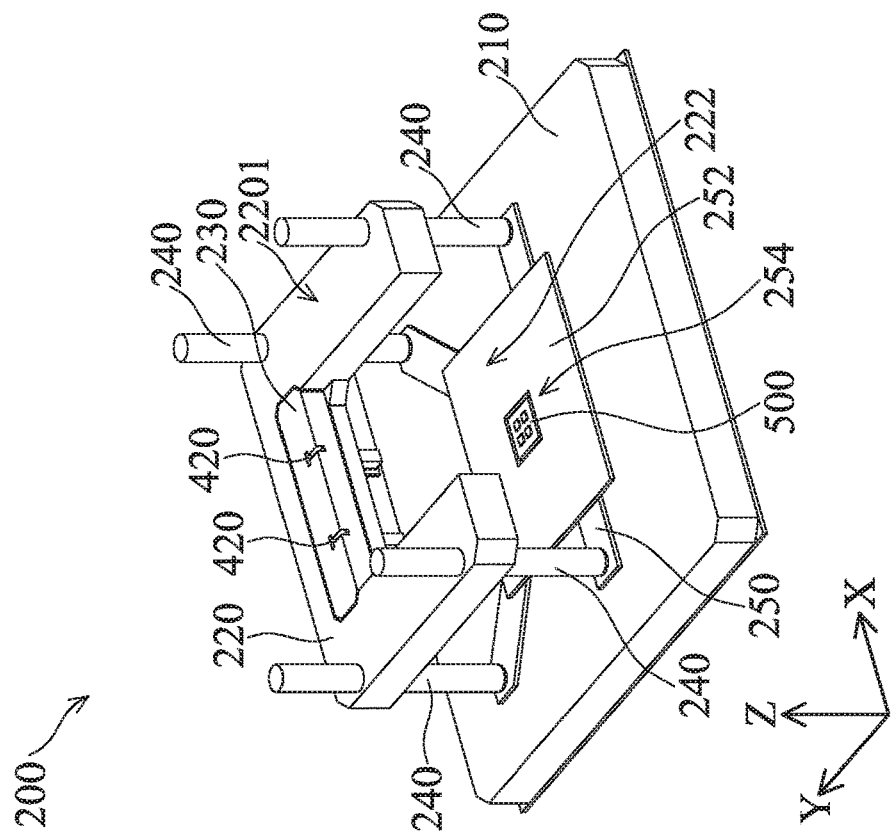
FIG. 4A is a perspective view of the housing, in accordance with some embodiments of the present disclosure.

FIG. 4A is a perspective view of the housing 200, in accordance with some embodiments of the present disclosure. FIG. 4B is a perspective view of the housing 200, in accordance with some embodiments of the present disclosure. FIG. 4C is a bottom view of the housing 200, in accordance with some embodiments of the present disclosure. Referring to FIG. 2C, FIG. 4A, FIG. 4B, and FIG. 4C, the housing 200 includes a base 210, a body 220, a connecting element 230, and a plurality of columns 240. The base 210 and the body 220 are connected by the columns 240, and the connecting element 230 is disposed on the body 220. In some embodiments, an intermediate connector 250 and a pad 252 are provided on the base 210 to reduce the space between the base 210 and the support 130 of the receiving module 100.

In some embodiments, the body 220 is U-shaped and has an opening 222. In some embodiments, as shown in FIG. 2A and FIG. 2D, the support 130 of the receiving module 100 is disposed in the opening 222 of the body 220, the bottom surface 1341 of the main body 134 may be in direct contact with the pad 252, and the bottom surface 1101 of the substrate 110 and the fasten element 104 are in direct contact with a top surface 2201 of the body 220.

In some embodiments, as shown in FIG. 4C, an opening 212 is formed on the base 210, and the opening 212 is partially covered by the pad 252. In some embodiments, the pad 252 has an opening 254, and the opening 254 overlaps the opening 212 when viewed from the Z direction, so that the antenna 500 may be disposed in the opening 254, as shown in FIG. 2C.

FIG. 5 is a perspective view of the antenna module 300 and the antenna 500, in accordance with some embodiments. In some embodiments, the antenna module 300 is used for holding the antenna 500, and includes a base 310 and a flexible film 320 disposed on the base 310.

Refer to FIG. 2C and FIG. 5. In some embodiments, the base 310 includes a fixture 312, a plurality of probes 314, and a circuit board 316. In some embodiments, the fixture 312 is disposed in an accommodating space of the circuit board 316. The probes 314 are disposed on the fixture 312 and penetrating the flexible film 320 to electrically connect to the antenna 500. The flexible film 320 is compatible for 5G/mmwave signal transmission, and is partially exposed from the circuit board 316 and partially disposed between the fixture 312 and the circuit board 316, and the flexible film 320 is pressurized or pushed by the fixture 312 and the circuit board 316 to be deformed. In some embodiments, wirings may be provided in the flexible film 320, so that the antenna testing apparatus 2 may be electrically connected to the antenna 500 through the flexible film 320 and the probes 314. In some embodiments, the antenna module 300 includes connectors 340 and cables 342, wherein the connectors 340 are disposed on the circuit board 316 and electrically connected to the flexible film 320, and the cables 342 are used to connect the connectors 340 to the antenna testing apparatus 2. In some embodiments, as shown in FIG. 2C, the feeding signal F is provided by the antenna testing apparatus 2 through the cables 342 and the flexible film 320 to the antenna 500, and the antenna 500 emits the excited signal E to the first coupling radiation element 120 in response to the feeding signal F. In some embodiments, the length of the probe 314 is short enough, such as about 50 µm. One advantage of the flexible film 320 is that the probe on the thin film is short, so its impedance is small enough to cause the signal loss neglectable. As a result, the impedance of the probes 314 is less enough to reduce the signal loss of the feeding signal F with high frequency during transmission, such as a frequency between about 15 GHz to about 39 GHz.

Referring to FIG. 2C, the connecting assembly 400 is disposed between the receiving module 100 and the housing 200, and includes the feeding radiation elements 410, second coupling radiation elements 420, and connectors 430 in some embodiments. The feeding radiation elements 410 are disposed on the substrate 110 of the receiving module 100, and are electrically connected to the first coupling radiation element 120 by the coupling wirings 405. The second coupling radiation elements 420 and the connectors 430 are disposed on the connecting element 230 of the housing 200, and a second coupling gap G2 is formed between one of the feeding radiation elements 410 and one of the second coupling radiation elements 420. In some embodiments, the second coupling radiation elements 420 may be exposed from the connecting element 230. In some embodiments, the second coupling radiation elements 420 are coupled to the antenna testing apparatus 2 through the connectors 430. Therefore, the excited signal E received by the receiving module 100 is coupled to the antenna testing apparatus 2 through the connecting assembly 400.

Figure 6A:
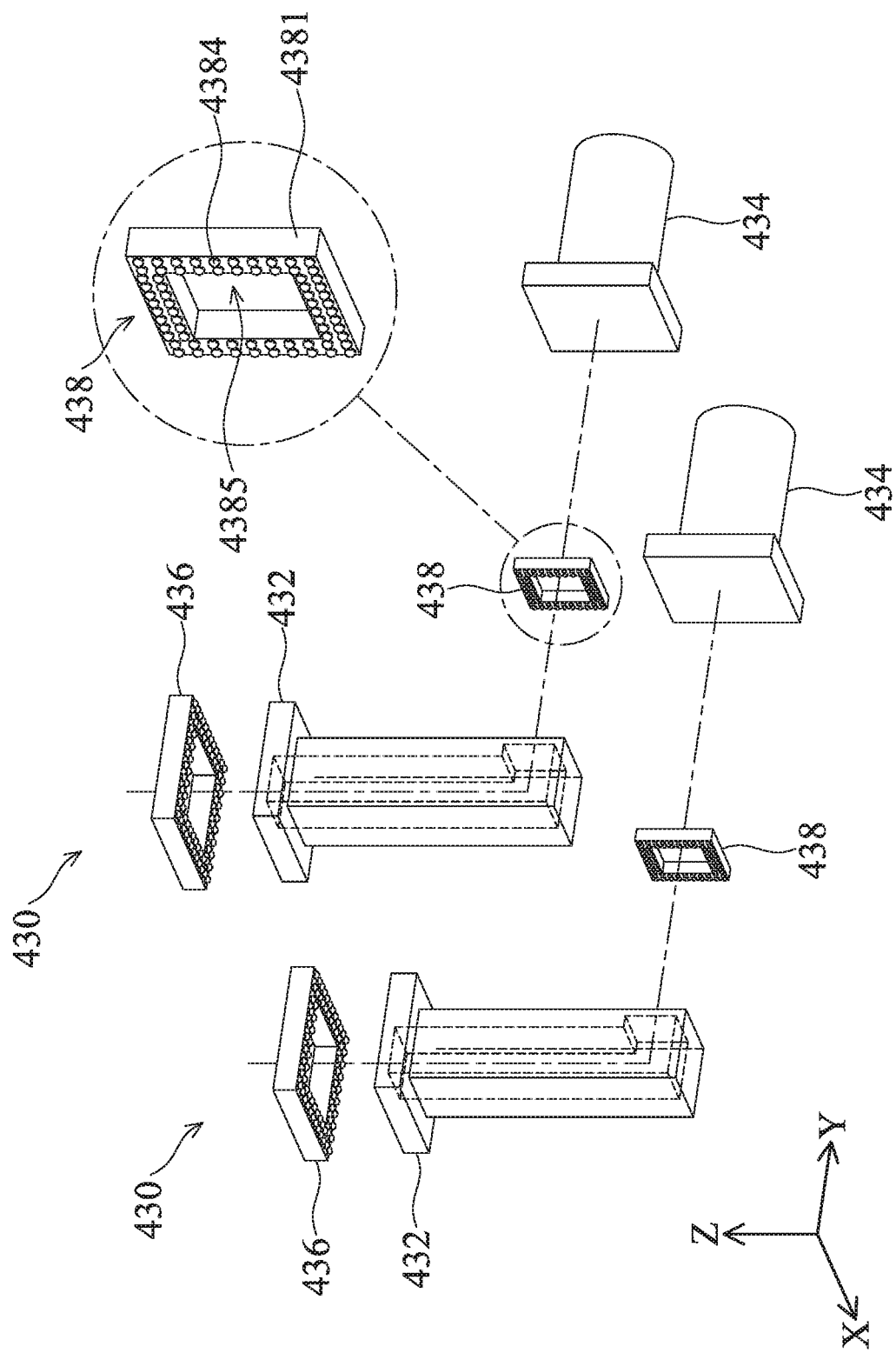
FIG. 6A is an exploded view of the connector, in accordance with some embodiments of the present disclosure.
Figure 6B:
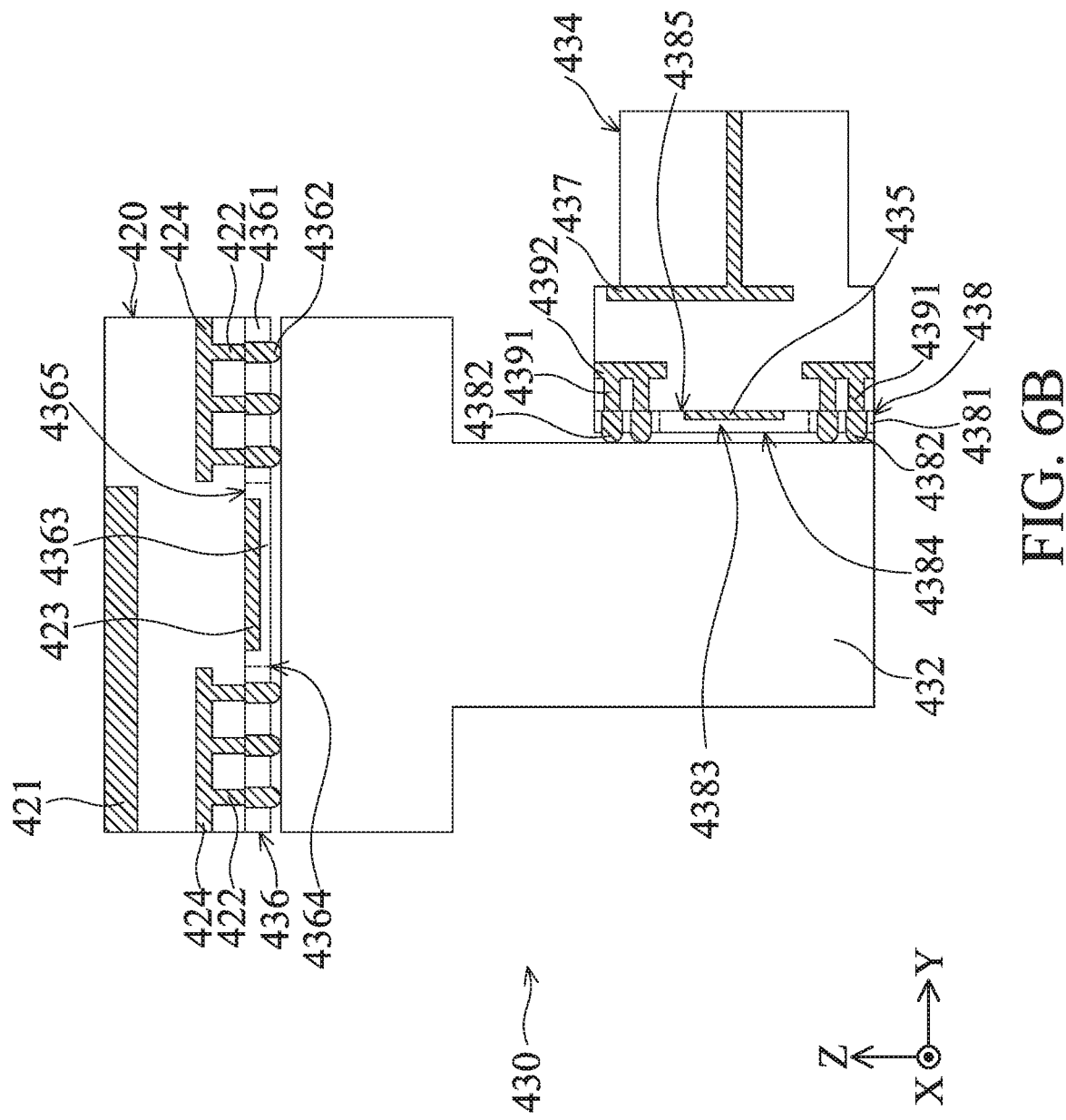
FIG. 6B is a schematic view of the second coupling radiation element and the connector, in accordance with some embodiments of the present disclosure.

FIG. 6A is an exploded view of the connector 430, in accordance with some embodiments of the present disclosure. FIG. 6B is a schematic view of the second coupling radiation element 420 and the connector 430, in accordance with some embodiments of the present disclosure. In some embodiments, each of the connectors 430 includes a first connecting portion 432 and a second connecting portion 434, and the first connecting portion 432 and a portion of the second connecting portion 434 are hollow. In some embodiments, the second connecting portion 434 is disposed on the first connecting portion 432. In some embodiments, the first connecting portion 432 is hollow and configured as a waveguide for the excited signal E, as shown in FIG. 6A.

In some embodiments, as shown in FIG. 6B, the second coupling radiation element 420 includes a wiring 421 and a third coupling radiation element 423, wherein the wiring 421 is electrically connected to the feeding radiation element 410, and the wiring 421 is coupled to the third coupling radiation element 423, so that the excited signal E may be transmitted from the feeding radiation element 410 to the wiring 421, and then transmitted to the third coupling radiation element 423. Furthermore, in some embodiments, as shown in FIG. 6B, the second connecting portion 434 includes a fourth coupling radiation element 435 and a wiring 437, wherein the fourth coupling radiation element 435 is coupled to the third coupling radiation element 423, and the wiring 437 is coupled to the fourth coupling radiation element 435, so that the excited signal E may be transferred from the third coupling radiation element 423 through first connecting portion 432 to the fourth coupling radiation element 435, and then coupled to the wiring 437 to transmit the signal to the antenna testing apparatus 2.

In some embodiments, the connector 430 further includes a first interposer 436. The first interposer 436 is disposed between the second coupling radiation element 420 and the first connecting portion 432. In some embodiments, the first interposer 436 includes a main body 4361 and a plurality of conductive columns 4362 disposed in the main body 4361. The main body 4361 has a first side 4364 and a second side 4365 opposite from the first side 4364. The conductive columns 4362 are partially exposed from a first side 4364 of the main body 4361 and in direct contact with the second coupling radiation element 420. In some embodiments, the second coupling radiation element 420 comprises vias 422 is in direct contact with the second side 4365 of the main body 4361. The conductive columns 4362 are electrically connected to the vias 422, and the vias 422 are electrically connected to a wiring 424 in the second coupling radiation element 420, wherein the wiring 424 is used for grounding, so that the conductive columns 4362 are also connected to a grounding voltage. In some embodiments, the first interposer 436 includes an opening 4363 surrounded by the conductive columns 4362, and the third coupling radiation element 423 may be disposed in the opening 4363, so that the excited signal E from the second coupling radiation element 420 may pass through the opening 4363 to the first connecting portion 432. In some embodiments, the conductive columns 4362 are resilient, so that the first interposer 436 may fit the space between the second coupling radiation element 420 and the first connecting portion 432 better. As a result, the excited signal E transmitted through the connector 430 may be shielded by the conductive columns 4362 which are connected to the grounding voltage, and the excited signal E may be prevented from leaking through the space between the second coupling radiation element 420 and the first connecting portion 432, so as to reduce the leakage loss of RF signal.

In some embodiments, the connector 430 further includes a second interposer 438. The second interposer 438 is disposed between the first connecting portion 432 and the second connecting portion 434. In some embodiments, the second interposer 438 includes a main body 4381 and a plurality of conductive columns 4382. The main body 4381 has a first side 4384 and a second side 4385 opposite from the first side 4384. The conductive columns 4382 are disposed in the main body 4381 and are partially exposed from the first side 4384 of the main body 4381, wherein the conductive columns 4382 are in direct contact with the second connecting portion 434. In some embodiments, the second connecting portion 434 comprises vias 4391 in direct contact with the second side 4385 of the main body 4381. The conductive columns 4382 are electrically connected to the vias 4391, and the vias 4391 are electrically connected to a wiring 4392 in the second connecting portion 434, wherein the wiring 4392 is used for grounding, so that the conductive columns 4382 are also connected to a grounding voltage. In some embodiments, the second interposer 438 includes an opening 4383 surrounded by the conductive columns 4382, and the fourth coupling radiation element 435 may be disposed in the opening 4383, so that the excited signal E may pass through the opening 4383 to the fourth coupling radiation element 435. As a result, the excited signal E transmitted through the connector 430 may be shielded by the conductive columns 4382 and be prevented from leaking through the space between the first connecting portion 432 and the second connecting portion 434.

Although the first interposer 436 and the second interposer 438 are shown in FIG. 6A, the present disclosure is not limited thereto. For example, in some embodiments, the first interposer 436 or the second interposer 438 may be omitted, depending on design requirement.

Figure 7B:
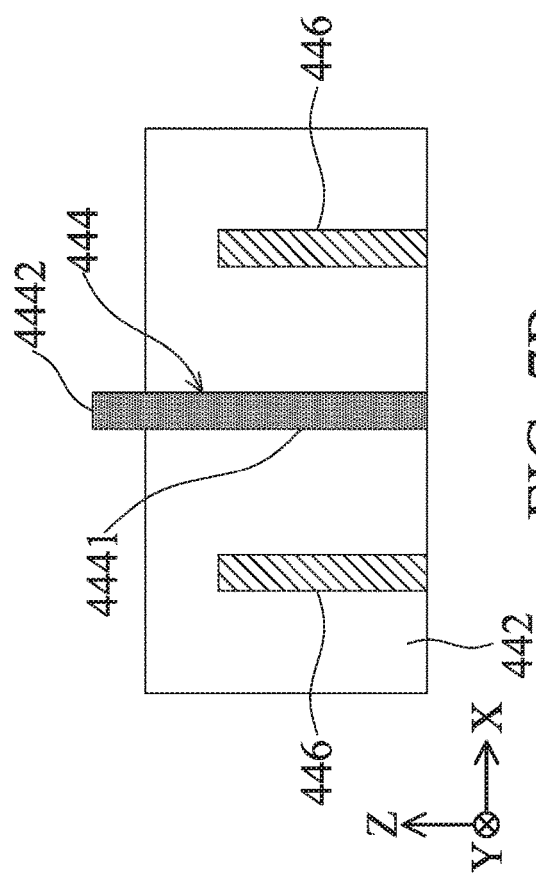
FIG. 7B is a cross-sectional view of a portion of the connecting element, in accordance with some embodiments of the present disclosure.
Figure 7A:
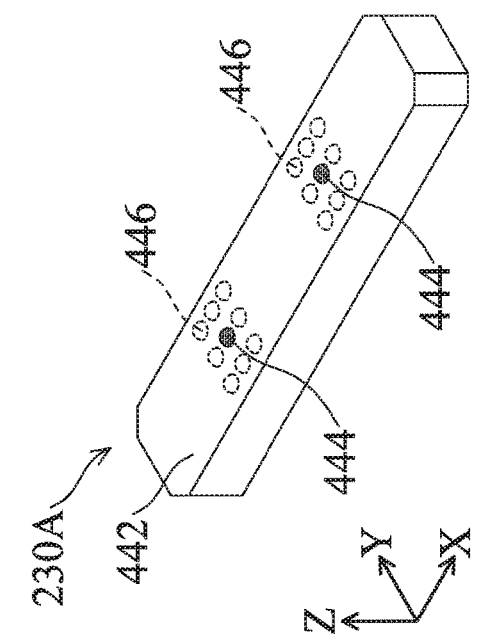
FIG. 7A is a schematic view of a connecting element, in accordance with some embodiments of the present disclosure.

The excited signal E may be transmitted to the antenna testing apparatus 2 in other configurations. For example, FIG. 7A is a schematic view of a connecting element 230A, and FIG. 7B is a cross-sectional view of a portion of the connecting element 230A in accordance with some embodiments of the present disclosure. The connecting element 230A may be used to substitute the connecting element 230 of the testing device 1 in the aforementioned embodiments. In some embodiments, as shown in FIG. 7B, the connecting element 230A includes a substrate 442 and first conductive via elements 444. The first conductive via elements 444 are disposed in the substrate 442 and electrically connected to the feeding radiation elements 410. In detail, each first conductive via element 444 includes a first portion 4441 and a second portion 4442. The first portion 4441 is embedded in the substrate 442. The second portion 4442 is retractable, such as a tip of a pogo pin, and can be exposed from the substrate 442. In some embodiments, the second portion 4442 is exposed from the substrate 442, and is used for in direct contact with the feeding radiation elements 410 to transmit the excited signal E provided by the feeding radiation elements 410.

In some embodiments, the connecting element 230A further includes second conductive via elements 446, wherein the second conductive via elements 446 are used for connecting to a grounding voltage, so that the excited signal E transmitted by the first conductive via element 444 may be shielded from being influenced by external electric field. In this configuration, the connector 430 in FIG. 6B may be omitted, and the excited signal E from the feeding radiation elements 410 may be transmitted by the first conductive via element 444 to the antenna testing apparatus 2 through a cable (not shown).

Figure 7D:
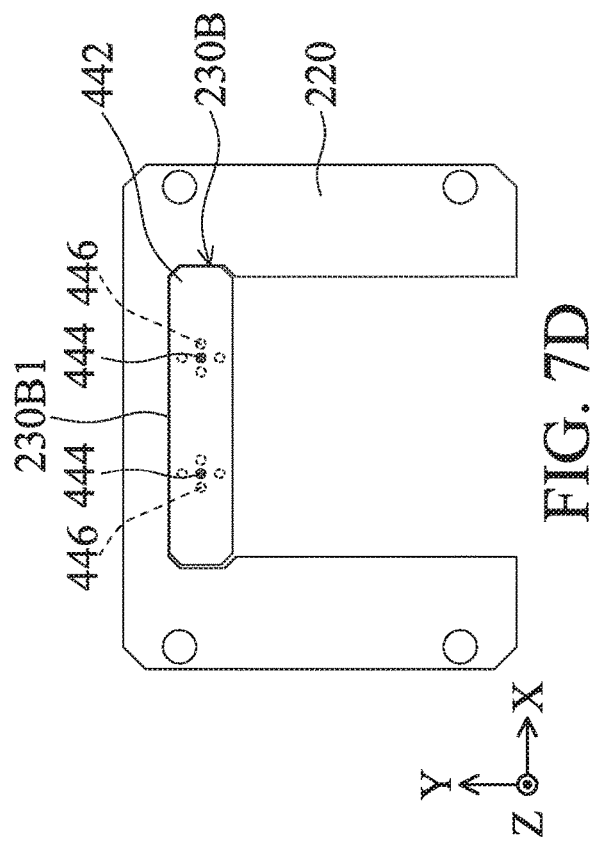
FIG. 7D is a top view of the connecting element, in accordance with some embodiments of the present disclosure.
Figure 7C:
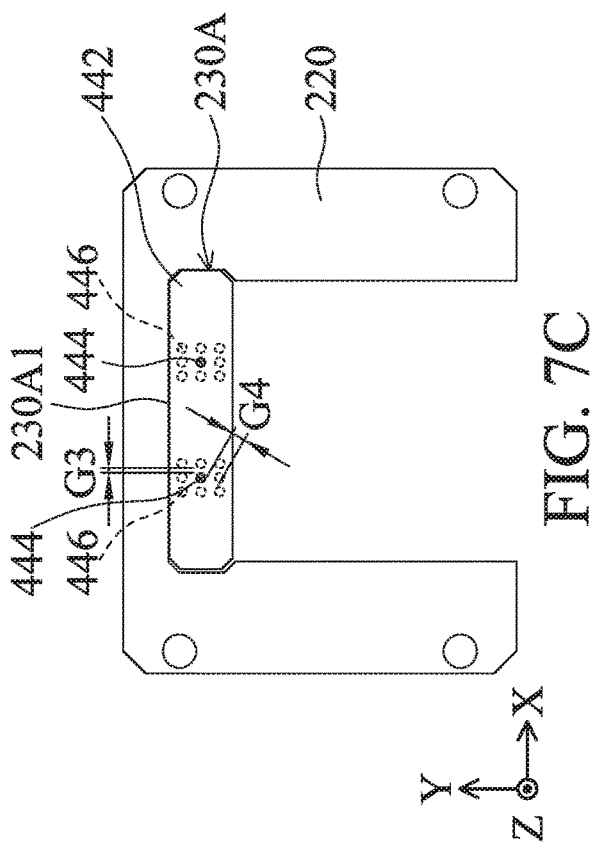
FIG. 7C is a top view of the connecting element, in accordance with some embodiments of the present disclosure.
Figure 7F:
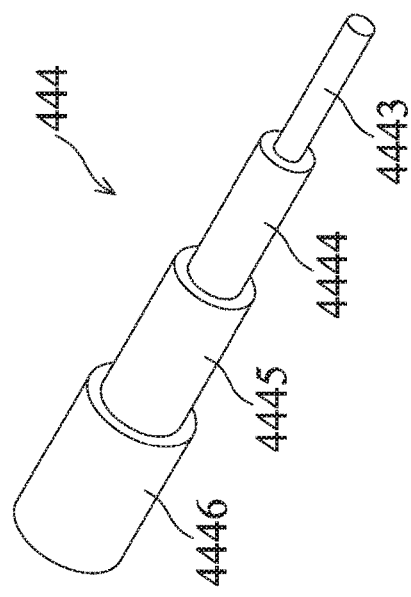
FIG. 7F is a schematic view of the first conductive via element, in accordance with some embodiments of the present disclosure.
Figure 7E:
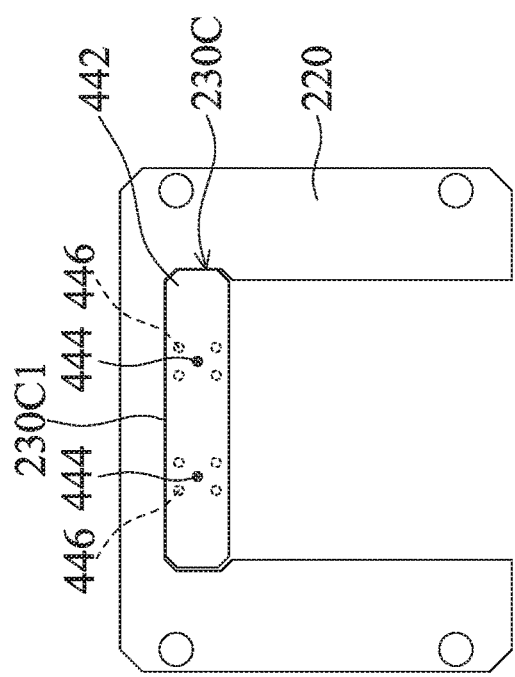
FIG. 7E is a top view of the connecting element, in accordance with some embodiments of the present disclosure.

In some embodiments, the connecting element 230A is disposed on the body 220, as shown in FIG. 7C to FIG. 7E. FIG. 7C is a top view of the connecting element 230A, in accordance with some embodiments of the present disclosure. In some embodiments, the first conductive via element 444 and the second conductive via elements 446 may arrange in X and Y directions, or may arrange to have an angle between about 30 degrees to about 60 degrees with a side 230A1 of the connecting element 230A, so that the first conductive via element 444 is surrounded by the second conductive via elements 446. The impedance of the first conductive via elements 444 may be controlled by the number of the second conductive via elements 446 or the distance between the first conductive via element 444 and the second conductive via elements 446, so that the available frequency range of the signal passed through may be controlled. In some embodiments, the second conductive via elements 446 are symmetrical to the first conductive via element 444. In some embodiments, a third coupling gap G3 is formed between the first conductive via element 444 and the second conductive via element 446 that are arranged in X or Y direction, or arranged substantially perpendicular or substantially parallel to the side 230A1, and a fourth coupling gap G4 is formed between the first conductive via element 444 and the second conductive via element 446 that are arranged in the diagonal of the connecting element 230A, wherein the third coupling gap G3 and the fourth coupling gap G4 are different. In some embodiments, the second conductive via elements 446 may be arranged with the feeding radiation elements 410 in FIG. 3C in the Z direction, so that the first conductive via element 444 may in direct with the feeding radiation elements 410.

FIG. 7D is a top view of a connecting element 230B, in accordance with some embodiments of the present disclosure. The connecting element 230B is similar to the connecting element 230A, and the difference is that the first conductive via element 444 and the second conductive via elements 446 are arranged in X and Y directions, or arranged substantially perpendicular or substantially parallel to a side 230B1 of the connecting element 230B. In some embodiments, the second conductive via elements 446 may be arranged with the feeding radiation elements 410 in FIG. 3C in the Z direction, so that the first conductive via element 444 may in direct with the feeding radiation elements 410.

FIG. 7E is a top view of a connecting element 230C, in accordance with some embodiments of the present disclosure. The connecting element 230C is similar to the connecting element 230A, and the difference is that the first conductive via element 444 and the second conductive via elements 446 are arranged to have an angle between about 30 degrees to about 60 degrees with a side 230C1 of the connecting element 230C. In some embodiments, the second conductive via elements 446 may be arranged with the feeding radiation elements 410 in FIG. 3C in the Z direction, so that the first conductive via elements 444 may in direct with the feeding radiation elements 410.

In some embodiments, the position of the feeding radiation elements 410 is interchangeable with the position of the first conductive via elements 444 and the second conductive via elements 446, which means the first conductive via elements 444 and the second conductive via elements 446 may be disposed in the substrate 110, and the feeding radiation elements 410 may be disposed on the connecting elements 230A, 230B, or 230C, depending on design requirement.

FIG. 7F is a schematic view of the first conductive via element 444, in accordance with some embodiments of the present disclosure. In some embodiments, the first conductive via element 444 may be a pogo pin, and may include a conductor 4443, a dielectric layer 4444, a conducting shield 4445, and an insulating layer 4446. The conductor 4443 is disposed in the dielectric layer 4444, the dielectric layer 4444 is surrounded by the conducting shield 4445, and the conducting shield 4445 is covered by the insulating layer 4446.

The conductor 4443 is used to transmit signal, such as the excited signal E. The dielectric layer 4444 is used to insulate the conductor 4443. The conducting shield 4445 is used to prevent magnetic fields outside the conducting shield 4445 from interfering with conducted signals. The insulating layer 4446 is used to prevent electric fields outside the insulating layer 4446 from interfering with conducted signals. In some embodiments, the second conductive via element 446 may have similar or identical structure to the first conductive via element 444, and the description is not repeated for simplicity.

Figure 8B:
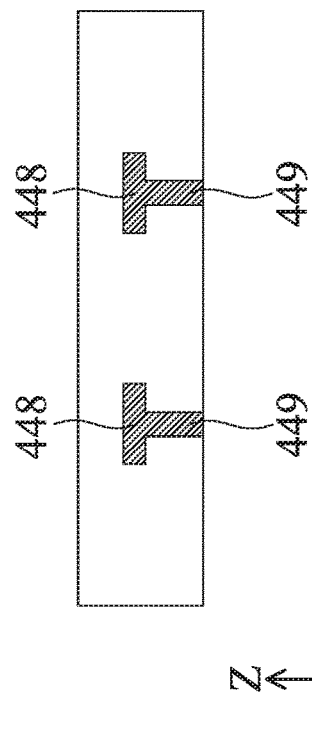
FIG. 8B is a cross-sectional view of the connecting element, in accordance with some embodiments of the present disclosure.
Figure 8A:
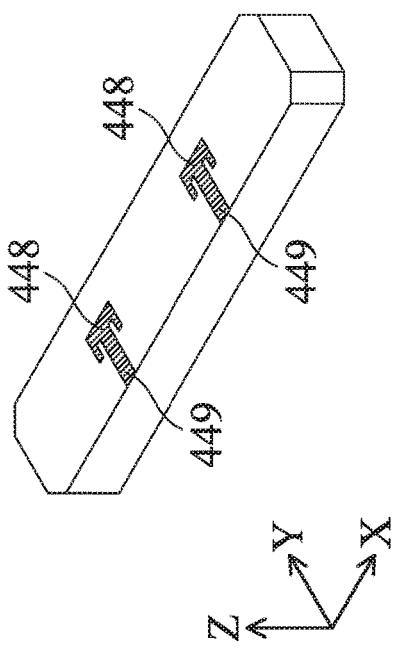
FIG. 8A is a schematic view of a connecting element, in accordance with some embodiments of the present disclosure.

FIG. 8A is a schematic view of a connecting element 230D, in accordance with some embodiments of the present disclosure. FIG. 8B is a cross-sectional view of the connecting element 230D, in accordance with some embodiments of the present disclosure. The connecting element 230D may be used to substitute the connecting element 230 or the connecting element 230A in aforementioned embodiments. As shown in FIG. 8A and FIG. 8B, the connecting element 230D includes two second coupling radiation elements 448 and wirings 449. The second coupling radiation elements 448 are coupled to the feeding radiation elements 410 to transmit the excited signal E without in direct contact with each other, and a second coupling gap is formed between the feeding radiation element 410 and the second coupling radiation element 448. For example, in some embodiments, the second coupling radiation element 448 and the feeding radiation element 410 are plate-shaped, and are arranged in a first direction (e.g. Z direction), and the antenna module 300 and the receiving module 100 are also arranged in the first direction. Afterwards, the excited signal E from the feeding radiation elements 410 may be transmitted by the second coupling radiation elements 448 to the antenna testing apparatus 2 through cables (not shown) connected to the wirings 449.

Figure 9:
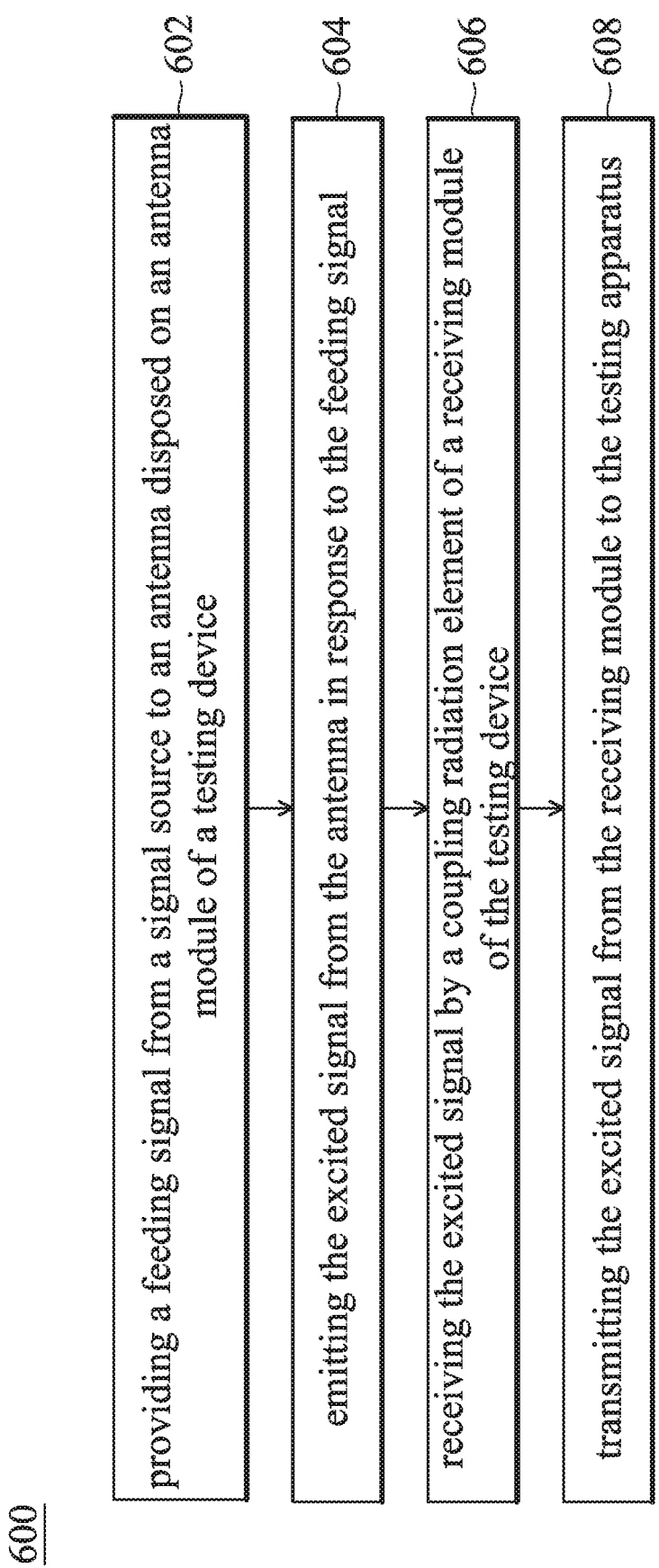
FIG. 9 is a process flow of a method for testing the antenna, in accordance with some embodiments of the present disclosure.

FIG. 9 is a process flow of a method 600 for testing the antenna 500, in accordance with some embodiments of the present disclosure. The method 600 starts from a step 602, wherein the feeding signal F is provided from the antenna testing apparatus 2 to the antenna 500 disposed on the antenna module 300 of the testing device 1. Afterwards, a step 604 is performed, which includes emitting the excited signal E from the antenna 500 in response to the feeding signal F. The method 600 then goes to a step 606, wherein the excited signal E is received by a first coupling radiation element 120 of a receiving module 100 of the testing device 1, the receiving module 100 is disposed on the antenna module 300, and the coupling radiation element 120 of the receiving module 100 is physically separated from the antenna 500. Finally, the method 600 goes to a step 608, which includes transmitting the excited signal E from the receiving module 100 to the antenna testing apparatus 2.

In summary, a testing device for testing an antenna is provided in some embodiments of the present disclosure. The testing device is used for testing an antenna in a wireless manner, and is suitable for testing an antenna with high frequency, such as an antenna operating in the millimeter region of the electromagnetic spectrum.

A testing device for testing an antenna is provided in some embodiments of the present disclosure. The testing device includes a housing, an antenna module, and a receiving module. The antenna module is used for holding the antenna and disposed under the housing, wherein the antenna is coupled to the antenna testing apparatus through the antenna module. The receiving module is disposed on the housing, and the coupling radiation element of the receiving module is physically separated from the antenna when testing the antenna, wherein the receiving module is configured to receive an excited signal emitted from the antenna.

A testing device for testing an antenna is provided in some embodiments of the present disclosure. The testing device includes a housing, an antenna module, a receiving module, and a connecting assembly. The antenna module is used for holding the antenna and disposed under the housing, wherein the antenna is configured to emit an excited signal. The receiving module is disposed on the housing and having a first coupling radiation element coupled to the antenna, wherein a first coupling gap is formed between the antenna and the first coupling radiation element. The connecting assembly is disposed between the housing and the receiving module, configured to transmit the excited signal to an antenna testing apparatus.

A method for testing an antenna is provided in some embodiments of the present disclosure. The method includes providing a feeding signal from an antenna testing apparatus to an antenna disposed on an antenna module of a testing device, emitting the excited signal from the antenna in response to the feeding signal, receiving the excited signal by a coupling radiation element of a receiving module of the testing device, wherein the receiving module is disposed on the antenna module, and the coupling radiation element is physically separated from the antenna, and transmitting the excited signal from the receiving module to the antenna testing apparatus.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A testing device for testing an antenna, comprising:
a housing;
an antenna module for holding the antenna and disposed under the housing, wherein the antenna is coupled to an antenna testing apparatus, and the antenna module comprises:
 a base disposed on the housing; and
 a flexible film disposed on the base, configured to transmit a feeding signal provided by the antenna testing apparatus to the antenna; and
a receiving module disposed on the housing and comprising:
 a coupling radiation element physically separated from the antenna; and
 a substrate, wherein the coupling radiation element is disposed on one side of the substrate facing the antenna and coupled to the antenna, and the receiving module is configured to receive an excited signal emitted from the antenna.

2. The testing device as claimed in claim 1, further comprising a connecting assembly disposed between the housing and the receiving module, wherein the excited signal received by the receiving module is coupled to the antenna testing apparatus through the connecting assembly.

3. The testing device as claimed in claim 1, wherein the base comprises:
a fixture;
a plurality of probes disposed on the fixture and penetrating the flexible film to electrically connect to the antenna; and
a circuit board, wherein the flexible film is partially exposed from the circuit board and partially disposed between the fixture and the circuit board.

4. The testing device as claimed in claim 1, wherein the antenna is exposed from the housing and the receiving module.

5. The testing device as claimed in claim 1, wherein the receiving module further comprises a support in direct contact with the antenna and disposed between the substrate and the antenna module.

6. A testing device for testing an antenna, comprising:
a housing;
an antenna module for holding the antenna and disposed under the housing, wherein the antenna is configured to emit an excited signal, and the antenna module comprises:
 a base disposed on the housing; and
 a flexible film disposed on the base, configured to transmit a feeding signal provided by the antenna testing apparatus to the antenna;
a receiving module disposed on the housing and having:
 a first coupling radiation element coupled to the antenna, wherein a first coupling gap is formed between the antenna and the first coupling radiation element; and a substrate, wherein the coupling radiation element is disposed on one side of the substrate facing the antenna and coupled to the antenna; and a connecting assembly disposed between the housing and the receiving module, configured to transmit the excited signal to an antenna testing apparatus, wherein the connecting assembly comprises:
 a feeding radiation element disposed on the receiving module and electrically connected to the first coupling radiation element;
 a second coupling radiation element disposed on the housing, and a second coupling gap is formed between the feeding radiation element and the second coupling radiation element; and
 a connector, wherein the second coupling radiation element is coupled to the antenna testing apparatus through the connector.

7. The testing device as claimed in claim 6, wherein the connector comprises a first connecting portion and a second connecting portion, wherein the second connecting portion is disposed on the first connecting portion, and the first connecting portion is hollow and configured as a waveguide for the excited signal.

8. The testing device as claimed in claim 7, wherein the connector further comprises an interposer disposed between the second coupling radiation element and the first connecting portion, or disposed between the first connecting portion and the second connecting portion.

9. The testing device as claimed in claim 8, wherein the interposer comprises a main body and a plurality of conductive columns disposed on of the main body, wherein the conductive columns are in direct contact with the first connecting portion.

10. The testing device as claimed in claim 9, wherein the main body has a first side and a second side opposite from the first side, the conductive columns are exposed from the first side, and the second coupling radiation element comprises vias in direct contact with the second side of the main body.

11. The testing device as claimed in claim 6, wherein the feeding radiation element and the second coupling radiation element are plate-shaped and arranged in a first direction, and the antenna module and the receiving module are arranged in the first direction.

12. The testing device as claimed in claim 11, wherein the feeding radiation element has a U-shaped slot.

13. The testing device as claimed in claim 6, wherein the connecting assembly comprises:
 a feeding radiation element disposed on the receiving module and electrically connected to the first coupling radiation element;
 a first conductive via element disposed on the housing and electrically connected to the feeding radiation element; and
 a plurality of second conductive via elements surrounding the first conductive via element.

14. A testing device for testing an antenna, comprising:
a housing;
an antenna module for holding the antenna and disposed under the housing, comprising:
 a first base;
 a flexible film disposed on the first base; and
 a connector disposed on the first base; and
a receiving module disposed on the housing and comprising:
 a coupling radiation element physically separated from the antenna;
 a first substrate; and
 a support in direct contact with the antenna and disposed between the first substrate and the antenna module, wherein the antenna is coupled to an antenna testing apparatus, and the receiving module is configured to receive an excited signal emitted from the antenna.

15. The testing device as claimed in claim 14, wherein the housing comprises:
 a second base;
 a body is in contact with the first substrate; and
 a plurality of columns connecting the second base and the body.

16. The testing device as claimed in claim 15, wherein the housing further comprises a connecting element disposed on the body, and the connecting element comprises:
 a second substrate disposed on the body;
 a first conductive via element disposed in the second substrate; and
 second conductive via elements disposed in the second substrate and surrounding the first conductive via element.

17. The testing device as claimed in claim 16, wherein the first conductive via element protrudes from the second substrate, and the second conductive via elements are embedded in the second substrate.

18. The testing device as claimed in claim 16, wherein the first conductive via element comprises:
 a conductor;
 a dielectric layer surrounding the conductor;
 a conducting shield surrounding the dielectric layer; and
 an insulating layer surrounding the conducting shield.

19. The testing device as claimed in claim 16, wherein the first conductive via element and the second conductive via elements are arranged in a direction perpendicular or parallel to a side of the connecting element.

20. The testing device as claimed in claim 16, wherein the first conductive via element and the second conductive via elements are arranged in a direction having an angle between 30 degrees to 60 degrees with a side of the connecting element.

* * * * *